(12) United States Patent
Mueller et al.

(10) Patent No.: US 8,125,046 B2
(45) Date of Patent: Feb. 28, 2012

(54) MICRO-ELECTROMECHANICAL SYSTEM DEVICES

(75) Inventors: Karl-Heinz Mueller, Velden (DE); Bernhard Winkler, Munich (DE); Robert Gruenberger, Nandlstadt (DE)

(73) Assignee: Infineon Technologies AG, Neubiberg (DE)

( * ) Notice: Subject to any disclaimer, the term of this patent is extended or adjusted under 35 U.S.C. 154(b) by 712 days.

(21) Appl. No.: 12/133,104

(22) Filed: Jun. 4, 2008

(65) Prior Publication Data

US 2009/0302415 A1 Dec. 10, 2009

(51) Int. Cl.
*H01L 21/70* (2006.01)
(52) U.S. Cl. . 257/522; 257/501; 257/508; 257/E23.013; 257/E23.014
(58) Field of Classification Search .................. 257/508, 257/501, 522, E23.013–E23.014
See application file for complete search history.

(56) References Cited

U.S. PATENT DOCUMENTS 5,846,849 A 12/1998 Shaw et al.
(Continued)

FOREIGN PATENT DOCUMENTS

DE 10 2008 062 499 A1 7/2009
(Continued)

*Primary Examiner* — Minchul Yang
(74) *Attorney, Agent, or Firm* — Slater & Matsil, L.L.P.

(57) ABSTRACT

Micro-electromechanical system (MEMS) devices and methods of manufacture thereof are disclosed. In one embodiment, a MEMS device includes a semiconductive layer disposed over a substrate. A trench is disposed in the semiconductive layer, the trench with a first sidewall and an opposite second sidewall. A first insulating material layer is disposed over an upper portion of the first sidewall, and a conductive material disposed within the trench. An air gap is disposed between the conductive material and the semiconductive layer.

28 Claims, 17 Drawing Sheets

U.S. PATENT DOCUMENTS

| | | |
|---|---|---|
| 6,531,331 B1 | 3/2003 | Bennett et al. |
| 6,624,726 B2 | 9/2003 | Niu et al. |
| 6,861,277 B1 | 3/2005 | Monroe et al. |
| 6,936,491 B2 | 8/2005 | Partridge et al. |
| 6,960,488 B2 | 11/2005 | Brosnihan et al. |
| 7,002,436 B2 | 2/2006 | Ma et al. |
| 7,071,031 B2 | 7/2006 | Pogge et al. |
| 7,172,917 B2 | 2/2007 | Partridge et al. |
| 7,256,107 B2 | 8/2007 | Takeuchi et al. |
| 2003/0112096 A1 | 6/2003 | Potter |
| 2004/0150043 A1 | 8/2004 | Holm et al. |
| 2004/0227201 A1 | 11/2004 | Borwick, III et al. |
| 2005/0036269 A1* | 2/2005 | Ma et al. .................... 361/301.1 |
| 2006/0208833 A1 | 9/2006 | Sung et al. |
| 2007/0170439 A1 | 7/2007 | Partridge et al. |
| 2007/0170528 A1 | 7/2007 | Partridge et al. |
| 2008/0050861 A1* | 2/2008 | Vancura et al. ............... 438/127 |
| 2009/0179286 A1 | 7/2009 | Schoen et al. |
| 2009/0278628 A1* | 11/2009 | Sworowski et al. .......... 333/186 |

FOREIGN PATENT DOCUMENTS

| | | | |
|---|---|---|---|
| WO | WO 2008/001253 A2 | 1/2008 | |

* cited by examiner

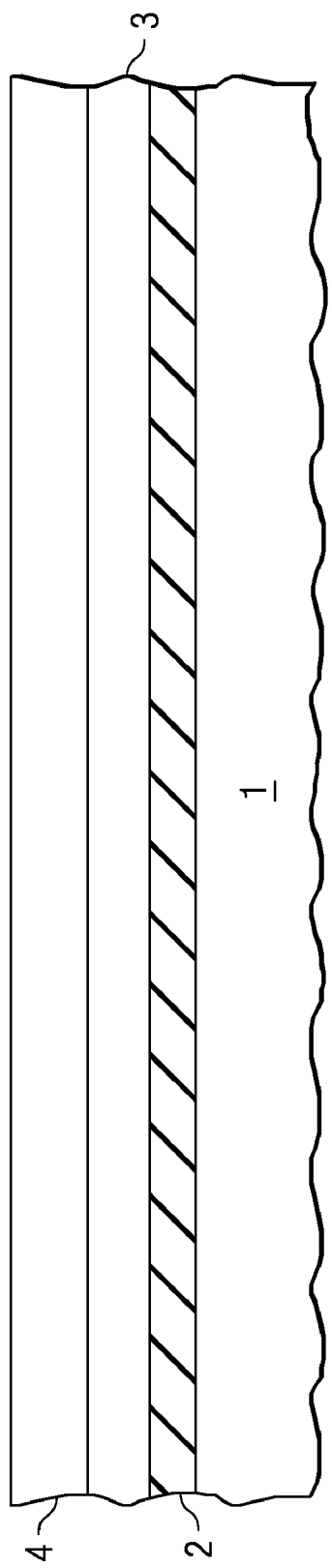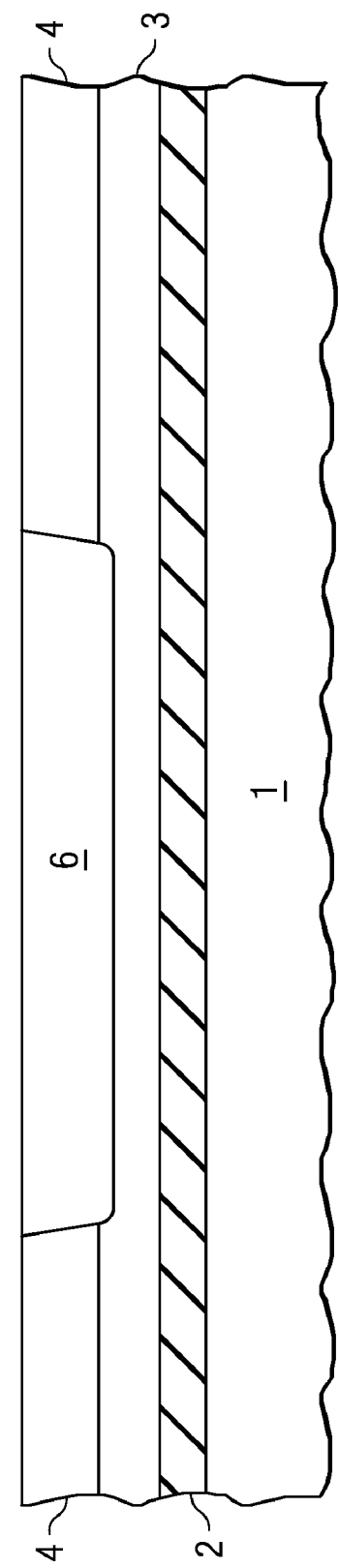

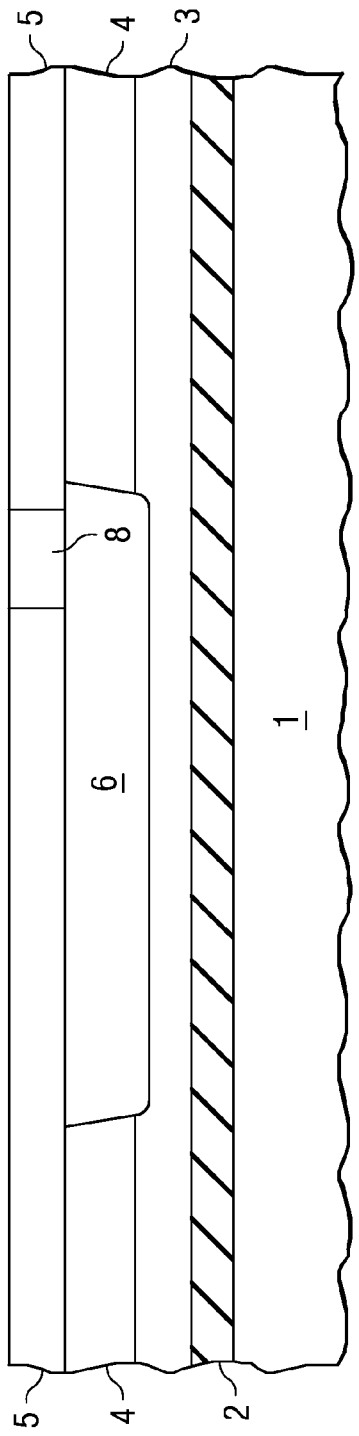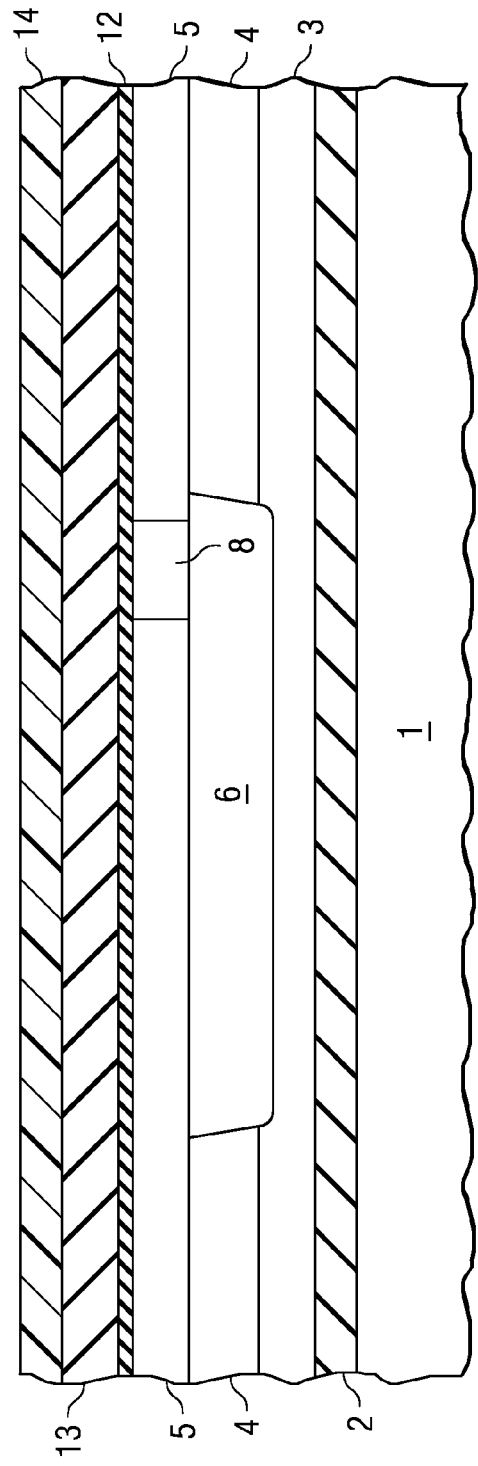

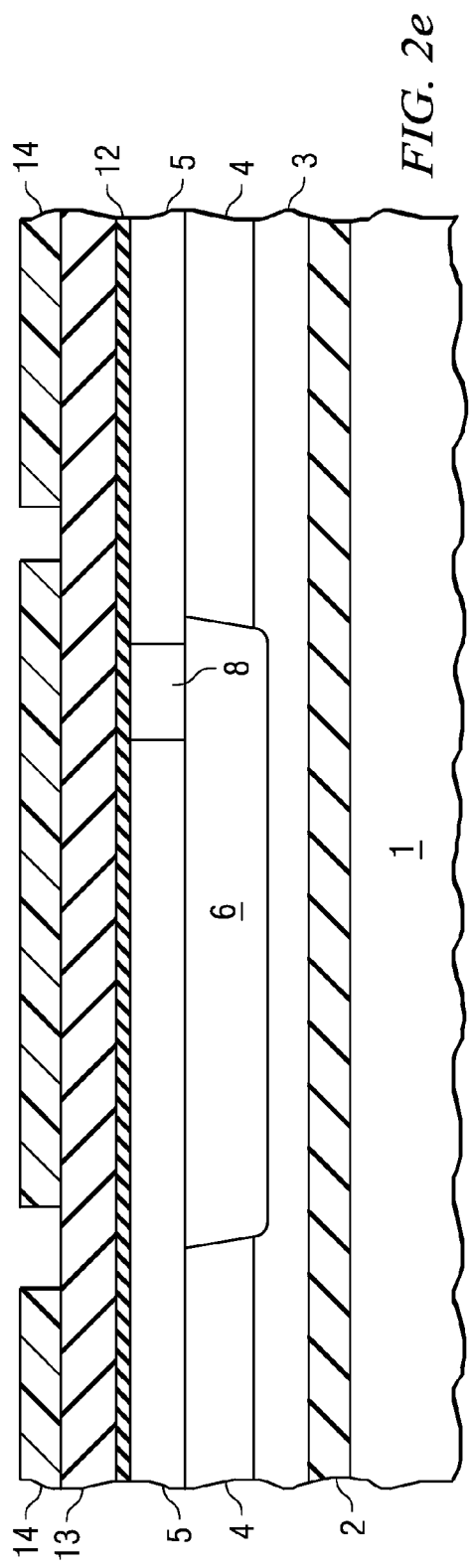
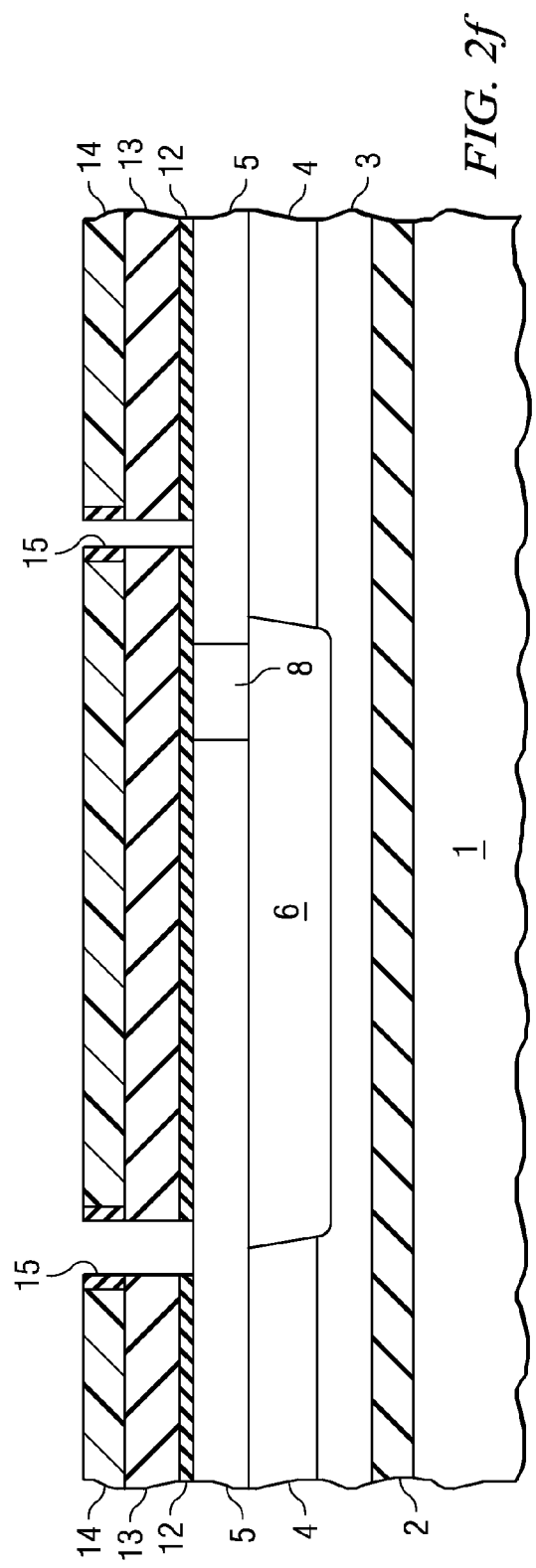

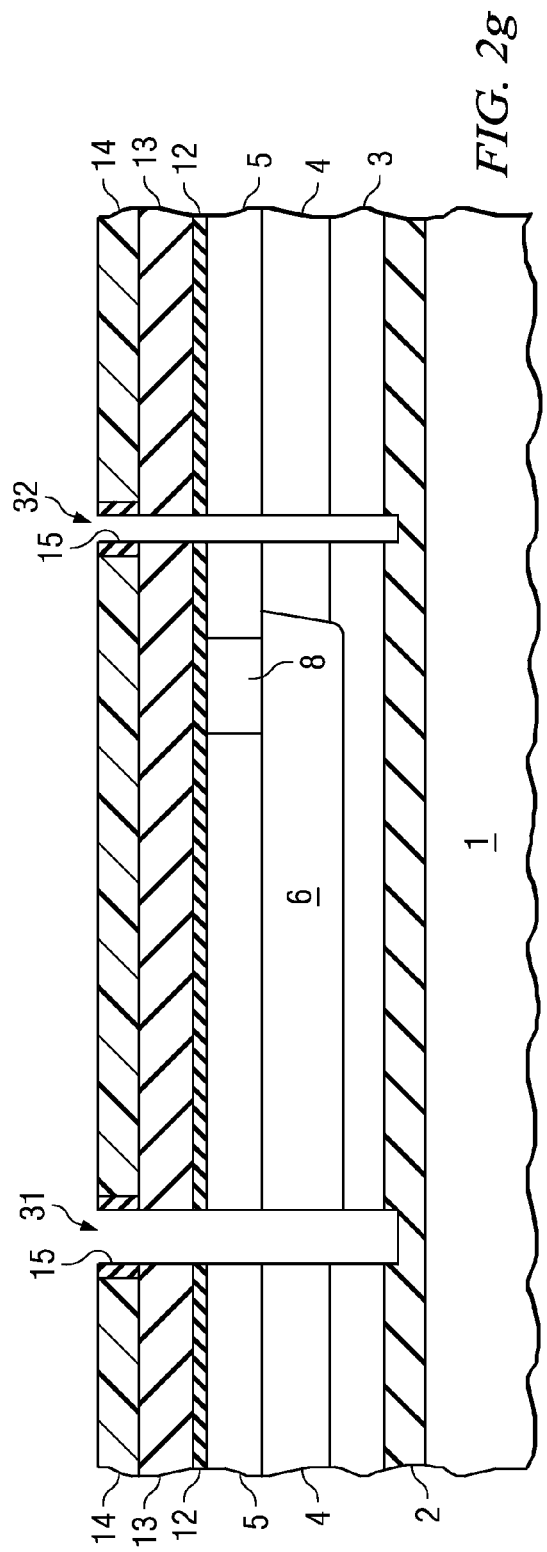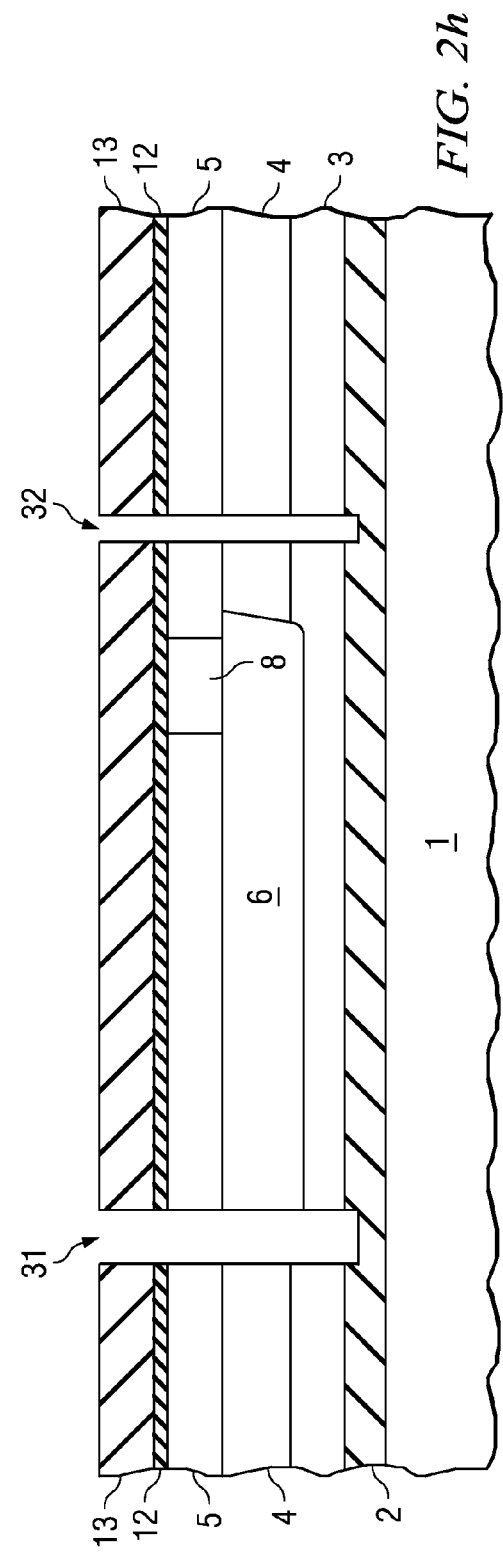

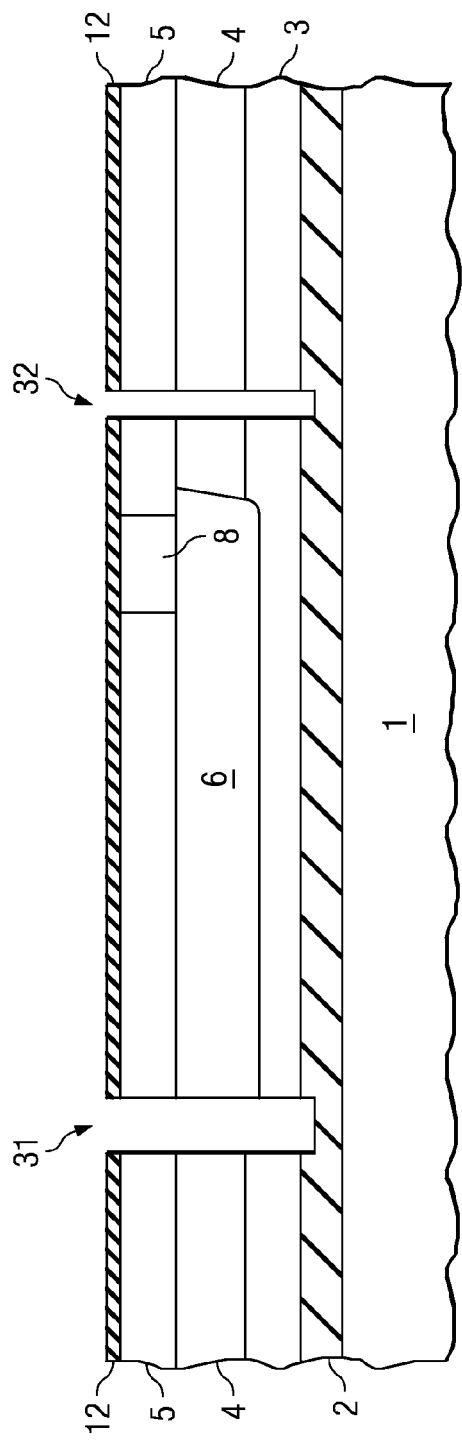
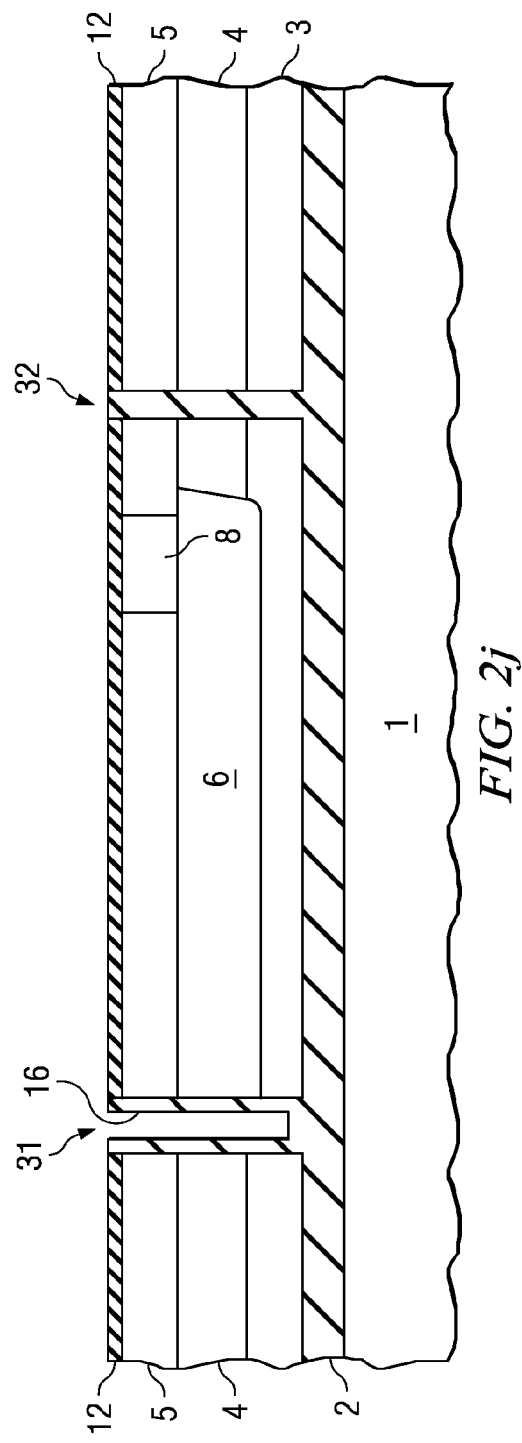
FIG. 2i
FIG. 2j

MICRO-ELECTROMECHANICAL SYSTEM DEVICES

TECHNICAL FIELD

The present invention relates generally to electronic devices, and more particularly to micro-electromechanical system (MEMS) devices.

BACKGROUND

MEMS devices comprise a relatively new technology that combines semiconductors with very small mechanical devices. MEMS devices are micro-machined sensors, actuators, and other structures that are formed by the addition, subtraction, modification, and patterning of materials using techniques originally developed for the integrated circuit industry. MEMS devices are used in a variety of applications, such as in sensors for motion controllers, inkjet printers, airbags, microphones, and gyroscopes. MEMS devices are increasingly used in a variety of applications such as mobile phones, automobiles, global positioning systems (GPS), video games, consumer electronics, automotive safety, and medical technology. Many potential and current applications require integration of MEMS devices with other types of chips or functionality. For example, MEMS devices may be integrated with bipolar, CMOS logic, or other peripheral devices such as trench or MIM capacitors.

Manufacturing MEMS devices is challenging in many aspects. Fabricating small moving parts of MEMS devices with lithography processes used in semiconductor technology has limitations. For example, lithography systems and processes restrict the minimum gap between moving and stationary parts of MEMS devices. Further, for reducing cost of these devices, it is imperative to minimize manufacturing costs.

Thus, what is needed in the art are cost effective structures for MEMS devices and methods of manufacture thereof.

SUMMARY OF THE INVENTION

These and other problems are generally solved or circumvented, and technical advantages are generally achieved, by embodiments of the invention.

Embodiments of the invention include MEMS devices and methods of manufacturing the MEMS devices. In accordance with an embodiment of the invention, the MEMS device comprises a semiconductive layer disposed over a substrate; a trench disposed in the semiconductive layer, the trench comprising a first sidewall and an opposite second sidewall. The MEMS device further comprises a first insulating material layer disposed over an upper portion of the first sidewall, and a conductive material disposed within the trench; and a first air gap disposed between the conductive material and the semiconductive layer.

The foregoing has outlined rather broadly the features and technical advantages of an embodiment of the present invention in order that the detailed description of the invention that follows may be better understood. Additional features and advantages of embodiments of the invention will be described, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments of the present invention and are not necessarily drawn to scale.

DETAILED DESCRIPTION OF ILLUSTRATIVE EMBODIMENTS

The making and using of various embodiments of the invention are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

MEMS resonators offer significant advantages compared to quartz resonators in terms of size, shock resistance, electromagnetic compatibility, performance, and integration into complementary metal oxide semiconductor (CMOS) or BiCMOS circuitry. However, MEMS devices based on silicon exhibit high motional resistance compared to quartz, which inhibits direct replacement of a quartz resonator by a silicon resonator in some applications. In addition, MEMS devices frequently require high operating voltages.

One way to overcome these limitations is to form MEMS devices with narrow gaps. The narrow gaps enable good electromechanical coupling, which enables operation at low bias voltages. For example, such narrow gap devices may be operable at voltages lower than 20V enabling integration with other electronic devices such as CMOS or RF/analog components. Similarly, narrow gaps in MEMS devices enable high frequency operation, for example, f>1 MHz, and enable achieving operational impedance levels at low bias voltages.

However, manufacturing devices with narrow gaps is challenging as the required dimensions are thinner than those allowed by typical lithography processes. Further, any specific processes introduced may not be compatible with processes for fabricating other components (e.g., CMOS devices) of the chip.

Embodiments of the invention overcome these limitations of MEMS devices. In various embodiments, the MEMS devices are fabricated with process flows common to standard CMOS and/or bipolar technologies. The MEMS devices thus fabricated comprise gaps formed by a subtractive process resulting in very narrow gaps between the electrodes of the MEMS resonator devices. Consequently, the MEMS devices exhibit high resonator quality factors and excellent capacitive coupling factors, resulting in low motional resistance values and low actuation voltages. Further, in various embodiments, the device regions of the MEMS devices are formed by processes common to the fabrication of other components such as trench isolation, trench capacitors, and bipolar transistors, thus reducing manufacturing costs.

The present invention will be described with respect to embodiments in specific contexts, namely implemented in MEMS resonator devices. Embodiments of the invention may also be implemented in other applications such as MEMS devices comprising sensors, actuators, switches, accelerometers, and other MEMS structures having moveable parts and elements.

Figure 1:
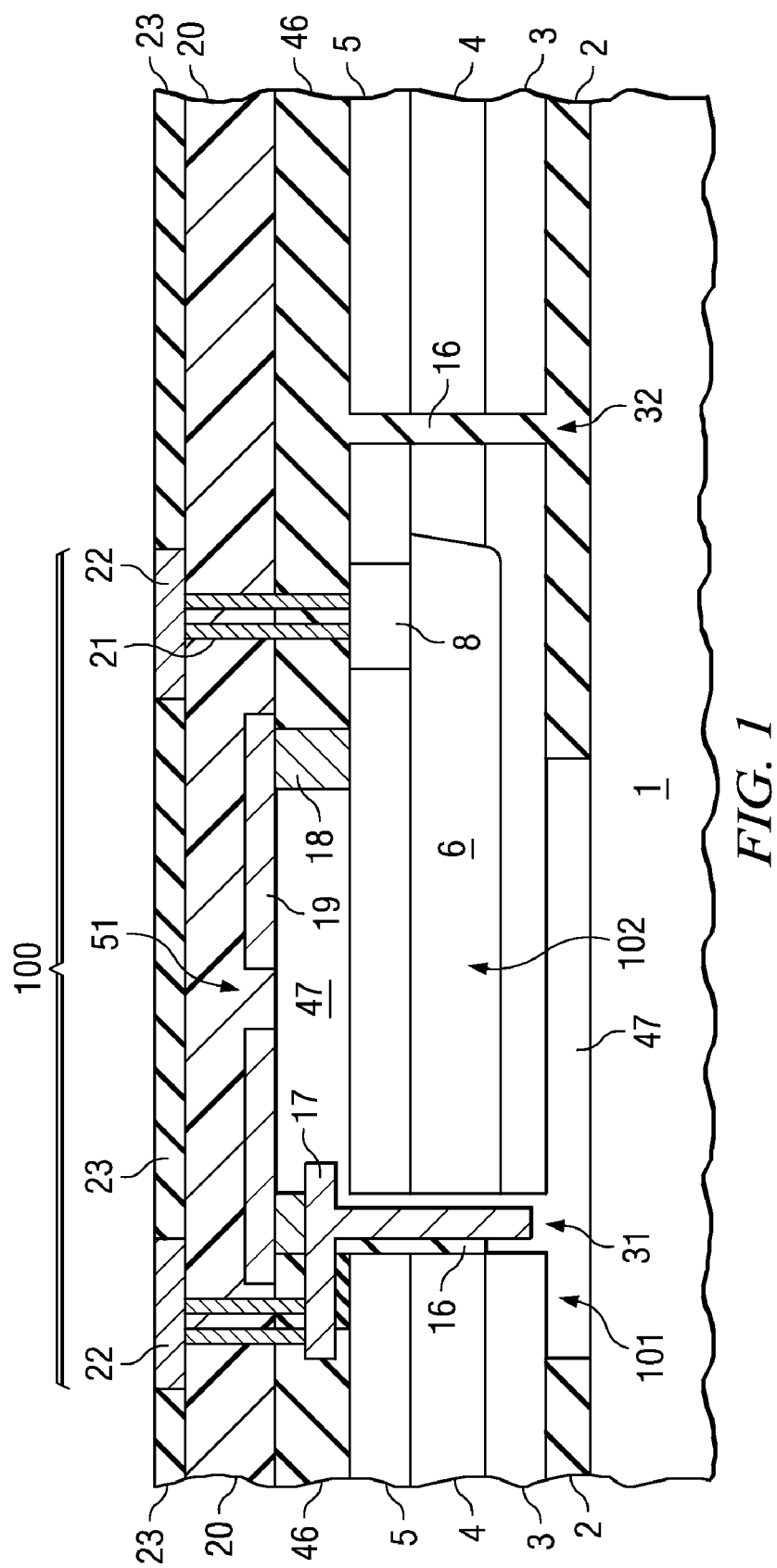
FIG. 1 illustrates a cross-sectional view of a MEMS device in accordance with an embodiment of the invention.

FIG. 1 illustrates a structural embodiment of a MEMS device in accordance to an embodiment of the invention. A method of fabricating the MEMS device using embodiments of the invention will be described with respect to the cross-sectional views of FIGS. 2a-2q, and the flow chart of FIG. 3. Additional structural embodiments of the MEMS device will then be described with respect to the cross-sectional views of FIGS. 4-8.

FIG. 1 illustrates a MEMS resonator device 100 in accordance with an embodiment of the invention. In various embodiments, the MEMS resonator device 100 comprises a first electrode 101 comprising a trench fill 17 of a first deep trench 31, a MEMS resonator electrode 102 comprising a second doped layer 6, and an air gap 47 between the electrodes. The air gap 47 is disposed below and around a portion of the second doped layer 6. The electrodes are contacted by suitable doped regions as well as contacts. The MEMS resonator device 100 is described in detail below, in accordance with an embodiment of the invention.

Referring to FIG. 1, the MEMS resonator device 100 includes a substrate 1. In one embodiment, the substrate 1 is a silicon-on-insulator (SOI) wafer. Some suitable examples of the substrate 1 are a bulk mono-crystalline silicon substrate (or a layer grown thereon or otherwise formed therein), a layer of (110) silicon on a (100) silicon wafer, or a germanium-on-insulator (GeOI) wafer. In other embodiments, other semiconductors such as silicon germanium, germanium, gallium arsenide, indium arsenide, indium gallium arsenide, indium antimonide or others can be used with the wafer. The substrate 1 may also include active components such as transistors or diodes, or passive components such as inductors or resistors, among others.

The substrate 1 includes a first insulating layer 2 disposed over the substrate 1. The first insulating layer 2 comprises a thickness of about 100 nm to about 1000 nm in one embodiment. The first insulating layer 2 comprises silicon dioxide, although some embodiments may comprise other materials such as silicon nitride, or silicon oxynitride.

A thin device layer 3 is disposed on the first insulating layer 2. The thin device layer 3 comprises a thickness of about 500 to about 1000 nm, although the thin device layer 3 may comprise a larger thickness in other embodiments. The thin device layer 3 comprises similar materials as described for the substrate 1, and comprises single crystal silicon. The thin device layer 3 is doped as an n-type or p-type region. The thin device layer 3 is doped n-type with arsenic or phosphorus atoms with a concentration of about $10^{15}/cm^3$ to about $10^{17}/cm^3$ in one embodiment. The thin device layer 3 can also be doped with lithography to achieve locally doped regions. In some embodiments, the thin device layer 3 may comprise amorphous silicon or polysilicon.

A first doped layer 4 is disposed on the thin device layer 3. The first doped layer 4 typically comprises an epitaxial layer used in the fabrication of other transistors such as bipolar and CMOS transistors. The first doped layer 4 comprises the same material as the thin device layer 3 in one embodiment. However, the first doped layer 4 comprises a different doping than the thin device layer 3. In various embodiments, the first doped layer 4 is doped as an n-type or p-type region. The first doped layer 4 is an n-type layer comprising arsenic or phosphorus atoms up to a concentration of about $10^{14}/cm^3$ in one embodiment. The first doped layer 4 comprises a thickness of about 250 nm to about 10,000 nm in one embodiment.

The second doped layer 6 is disposed adjacent the first doped layer 4 and over the thin device layer 3. The second doped layer 6 is also disposed adjacent a portion of the thin device layer 3. The second doped layer 6 is a low resistance region and comprises high doping. The second doped layer 6 comprises the same type of doping as the first doped layer 4 in one embodiment. The second doped layer 6 is an n-type layer comprising arsenic or phosphorus atoms up to a concentration of about $10^{19}/cm^3$ to about $10^{21}/cm^3$ and typically about $10^{20}/cm^3$ in one embodiment.

A third doped layer 5 is disposed above the first doped layer 4 and the second doped layer 6. The third doped layer 5 comprises a same doping type as the first doped layer 4. The third doped layer 5 is an n-type layer comprising arsenic or phosphorus atoms up to a concentration or p-type comprising boron atoms of about $>10^{15}/cm^3$ in one embodiment. In various embodiments, the third doped layer 5 and underlying first doped layer 4 comprises other components such as CMOS logic Bipolar Devices, RF/analog components, peripheral devices and/or others, forming a single chip.

A fourth doped layer 8 is disposed adjacent the third doped layer 5 and above the second doped layer 6. The fourth doped layer 8 comprises a low resistance region and comprises a same type of doping as the second doped layer 6. The fourth doped layer 8 is doped to a concentration of about $10^{19}/cm^3$ to about $10^{21}/cm^3$ and at least about $10^{20}/cm^3$ in some embodiments.

The first deep trench 31 is disposed adjacent the second doped layer 6, and disposed between the second doped layer 6 and the first doped layer 4. The first deep trench 31 comprises a depth from about 500 nm to about 10,000 nm.

The first deep trench 31 comprises an inner core and an outer shell or lining. The inner core of the first deep trench 31 is filled with the trench fill 17 comprising a conductive material. The trench fill 17 can comprise polysilicon although in other embodiments, other materials such as amorphous silicon, amorphous polysilicon, silicon germanium (SiGe), silicon carbon or carbon may be used. Some embodiments may also use metallic materials as the trench fill 17. Examples of suitable metallic materials comprising the trench fill 17 include metallic nitrides such as TiN, TaN, and WN, metal silicides such as TiSi, WSi, CoSi, and NiSi, and metals such as Ti, Ta, W, Ru, Al, Cu, and Pt, or combinations thereof. Part of the outer shell is covered by a second insulating layer 16. The second insulating layer 16 comprises silicon dioxide, although some embodiments may comprise other materials such as silicon nitride, or silicon oxynitride.

An air gap 47 is disposed over the remaining part of the outer shell of the first deep trench 31. The air gap 47 is hence disposed between the second doped layer 6 and the trench fill 17. The air gap 47 comprises gas at low pressures. However, in some embodiments air gap 47 comprises gas at pressures up to atmospheric pressure. The gas in the air gap 47 is inert (e.g., nitrogen, argon) in one embodiment to prevent oxidation of the trench fill 17. However, if the oxide of the trench fill 17 is also conductive, this limitation may be relaxed. The air gap 47 in a region between the second doped layer 6 and the trench fill 17 comprises a thickness of about 5 nm to about 500 nm, and less than about 100 nm, in one embodiment. However, embodiments used, for example, in wireless communication require devices with high quality factors (minimize non conservative loss of energy) and low phase noise. In such embodiments, a resonator device with a high Q-factor is formed with a large air gap to also minimize phase noise. For example, an air gap of about 500 nm is about optimum. Increasing the air gap further while reducing phase noise, disadvantageously increases the required supply or drive voltage.

A third insulating layer 46 is disposed above the third doped layer 5 and the fourth doped layer 8. Fourth insulating layers 18 are disposed above the trench fill 17. The fourth insulating layers 18 provide support for the cover layer 19 that forms an opening into the air gap 47. The fourth insulating layers 18 comprise a nitride, e.g., silicon nitride in one embodiment.

The opening 51 of the air gap 47 is encapsulated by a fifth insulating layer 20, the fifth insulating layer 20 being disposed above the third insulating layer 46 and the fourth insulating layers 18. The fifth insulating layer 20 comprises a planarizing oxide in one embodiment, although other suitable sealant materials may be used in other embodiments. The fifth insulating layer 20 seals the air gap 47 and maintains the integrity of the air gap 47.

Contacts 21 disposed in the third insulating layer 46 contact the fourth doped layer 8 and the trench fill 17. The contacts 21 are connected to pads 22 or metallization levels that help to make electrical contact to the devices and to connect to other components on the chip. A sixth insulating layer 23 is disposed on the fifth insulating layer 20. The sixth insulating layer 23 comprises a passivation layer.

A second deep trench 32 is also disposed on an opposite side of the second doped layer 6 if further electrical isolation is required. The second deep trench 32 connects to the first insulating layer 2 and the third insulating layer 46 completely isolating the MEMS device. For example, second deep trench 32 is narrower than the first deep trench 31 and is hence completely filled with the second insulating layer 16.

It is noted that FIG. 1 illustrates a cross section, and various structures with different top cross sections can be formed. For example, the MEMS device 100 may comprise a square, rectangular, or disk shaped top cross section. Correspondingly, the vibration mode of the MEMS resonator may comprise different modes, for example, vertical, longitudinal, and combinations thereof. Although described with respect to a first deep trench and a second deep trench, other embodiments may comprise more trenches forming the MEMS resonator device 100.

A method of fabricating the MEMS device using embodiments of the invention will be described with respect to the cross-sectional views of FIGS. 2a-2q, and the flow chart of FIG. 3.

Referring to FIG. 2a, a silicon-on-insulator (SOI) wafer is used as a starting material. The SOI wafer comprises a first insulating layer 2 deposited over a substrate 1. A thin device layer 3 is disposed over the first insulating layer 2. The thin device layer 3 comprises a silicon layer doped to a low n-type doping in one embodiment. A first doped layer 4 is first grown selectively from the thin device layer 3. The first selective epitaxial growth process used is commonly shared in the fabrication of other components such as bipolar, CMOS transistors, and comprises, for example, a chemical vapor deposition process. In other embodiments, other deposition processes, for example, epitaxy can be used. The first doped layer 4 grown using the first epitaxial growth process comprises the same material as the thin device layer 3. The first doped layer 4 is an n-type layer comprising phosphorus atoms, p-type comprising boron atoms up to a concentration of about $>10^{14}/cm^3$.

Referring to FIG. 2b, a resonator electrode layer is doped. A first mask layer is deposited over the first doped layer 4 (not shown). Using a first lithographic process, a portion of the first doped layer 4 is opened. Arsenic or phosphorus atoms are implanted at heavy doses to highly dope the opened area of the first doped layer 4. Arsenic or phosphorus is implanted into the first doped layer 4 at doses from about $10^{14}$ cm$^{-3}$ to about $5\times10^{16}$ cm$^{-3}$ in one embodiment. The implanted wafer is annealed to form a second doped layer 6. The diffused second doped layer 6 extends into the thin device layer 3 as illustrated in FIG. 2b. After the anneal, the second doped layer 6 comprises a doping of about $10^{19}/cm^3$ to about $10^{21}/cm^3$ and typically about $10^{20}/cm^3$ in one embodiment. The second doped layer 6 thus formed comprises the resonator electrode of the MEMS resonator device 100. If bipolar transistors are fabricated, corresponding implants, for example, for forming the collector regions are fabricated by implanting into the first doped layer 4, followed by annealing.

As illustrated in FIG. 2c, a third doped layer 5 is deposited above the first doped layer 4 and the second doped layer 6 using a second epitaxial growth process. The third doped layer 5 comprises the same doping type as the first doped layer 4. The third doped layer 5 is an n-type layer comprising phosphorus atoms up to a concentration of about $10^{15}/cm^3$ in one embodiment.

Using a second lithographic process, a portion of the third doped layer 5 is opened. Arsenic or phosphorus atoms are implanted at heavy doses to dope the exposed third doped layer 5. The implanted wafer is annealed to form a fourth doped layer 8. The fourth doped layer 8 is thus disposed adjacent the third doped layer 5, and above the second doped layer 6. The fourth doped layer 8 is doped to a concentration of about $5\times10^{19}/cm^3$ to about $10^{21}/cm^3$ and at least about $10^{20}/cm^3$ in one embodiment to minimize resistances. Other active devices, for example, CMOS or bipolar devices, if fabricated are also processed at this time. For example, if CMOS devices are built, the third doped layer 5 is doped by further implantations and anneals to form source, drain and channel regions. Similarly, after suitable masking, the emitter and base regions of bipolar devices are fabricated by implanting into the third doped layer 5, followed by annealing.

As illustrated in FIG. 2d, an etch stop liner 12 is deposited over the third doped layer 5. The etch stop liner 12 comprises a nitride liner in one embodiment, although other suitable materials with sufficient etch selectivity may be used in other embodiments. A trench hard mask layer 13 and a poly hard mask layer 14 are deposited.

Referring to FIGS. 2e and 2f, the hard mask layers are patterned to form trenches. The trench pattern may comprise different dimensions. For example, trenches for isolation and MEMS device electrodes may comprise different trench dimensions. Using a third lithography process, the poly hard mask layer 14 is patterned (FIG. 2e). A trench mask layer is deposited and etched to form a trench mask spacers 15 on the sidewalls of the poly hard mask layer 14. The trench mask spacer 15 creates small trench dimensions by reducing the width of the trench. Consequently, trench widths below lithography capability are formed in different embodiments for forming narrow trenches, e.g., second deep trench 32. A reactive ion etch (RIE) process is used to form the trenches. The RIE process is stopped on the etch stop liner 12 and followed by a wet etch to remove the etch stop liner 12 (FIG. 2f).

Referring to FIG. 2g, after the removal of the etch stop liner 12, a second RIE process is used to etch the underlying silicon layers. The RIE etch is stopped when it reaches the first insulating layer 2 comprising an oxide. Deep trenches are formed using RIE and use processes common to formation of deep trenches in other devices, for example, trench capacitors. For example, in FIG. 2g, the first deep trench 31 is formed from a process common to the formation of trench capacitors.

As illustrated in FIGS. 2h and 2i, the poly hard mask layer 14, and then the trench hard mask layer 13 are removed, stopping on the etch stop liner 12. Referring to FIG. 2j, a thin layer of a second insulating layer 16 is deposited into the first and second deep trenches 31 and 32. In different embodiments, the second insulating layer 16 is thermally grown via oxidation to form a thin controlled layer of thermal oxide. Alternately, a thin nitride or oxynitride may be deposited over the trench sidewalls and further oxidized using a thermal oxidation process. The second insulating layer 16 forms a liner on the sidewalls of the first deep trench 31, whereas being narrower, the second insulating layer 16 fills up the second deep trench 32. An anisotropic etch is used to remove the second insulating layer 16 from the top surface of the etch stop liner 12 (FIG. 2j).

Figure 2K:
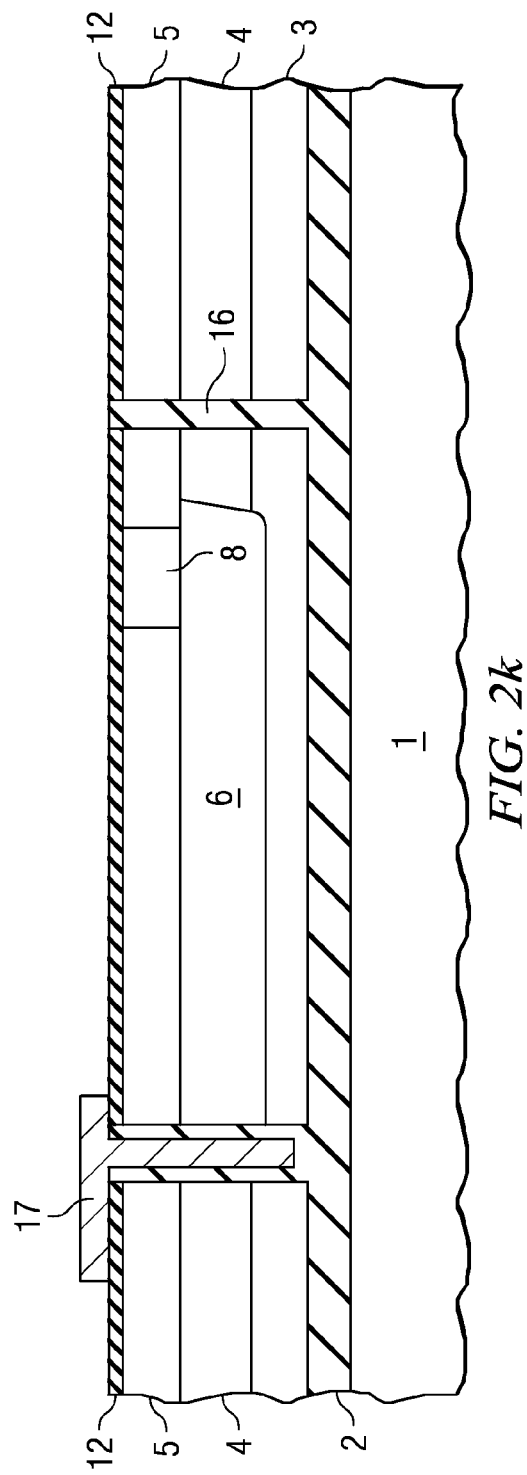
FIG. 2, which includes
FIGS. 2a-2q, illustrates cross-sectional views of a MEMS device at various stages of fabrication in accordance with an embodiment of the invention.
Figure 3:
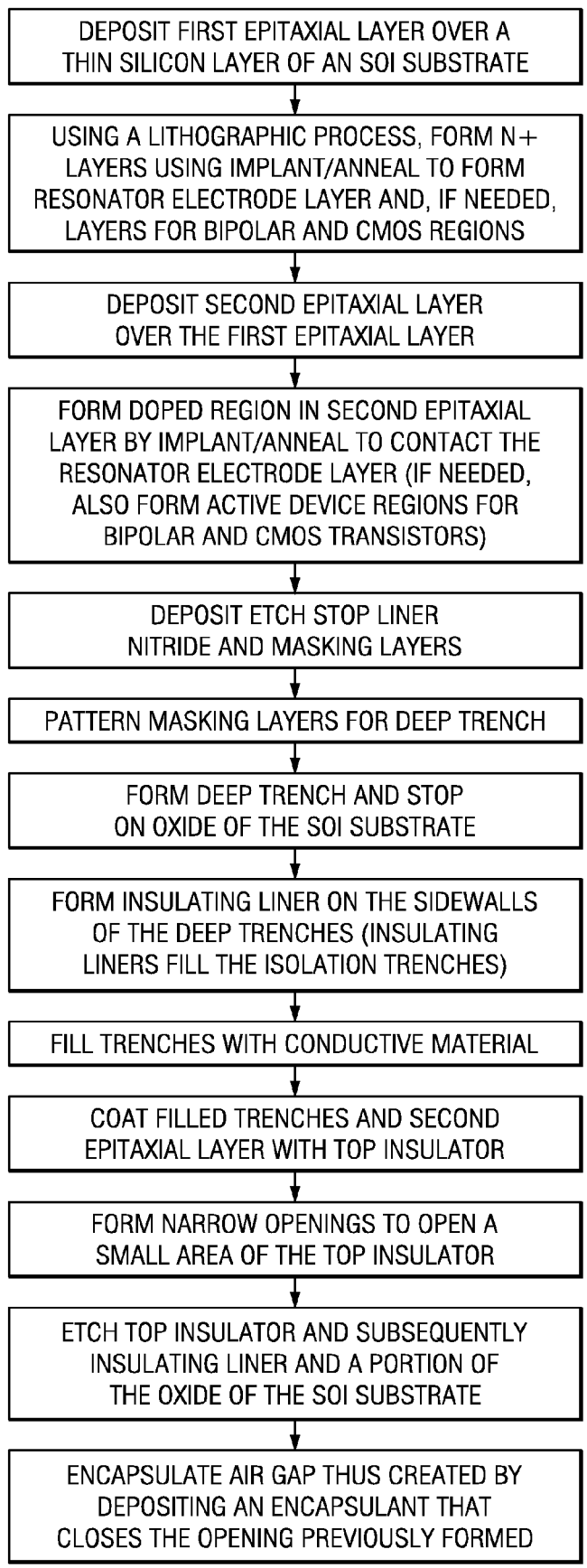
FIG. 3 illustrates a flow chart describing the stages of fabrication of the MEMS device described in FIG. 2, in accordance with an embodiment of the invention.

Referring to FIG. 2k, a driver electrode is formed. A trench fill 17 comprising a conductive material is deposited into the first deep trench 31 forming an inner core of the driver electrode. The trench fill 17 is doped polysilicon deposited using, for example, a low pressure chemical vapor deposition process in one embodiment. In other embodiments, the trench fill 17 may comprise other conductive materials such as amorphous Si, SiGe, or SiC among others. For example, in one embodiment the trench fill 17 may comprise a conductive outer liner and a conductive inner fill. For example, the conductive outer liner may comprise a material to protect against structural failure, out-diffusion of conductive inner fill, or thermal failure during subsequent processing. In various embodiments, the conductive outer liner may comprise TiN. The conductive inner fill may also comprise metal such as Ti, Ta, Ni, Co, Pt, W, corresponding silicides, corresponding nitrides, corresponding oxides, or combinations thereof. The trench fill 17 is patterned to form a structure as illustrated in FIG. 2k. Additional components such CMOS gates may also be deposited and patterned during this step.

Figure 2L:
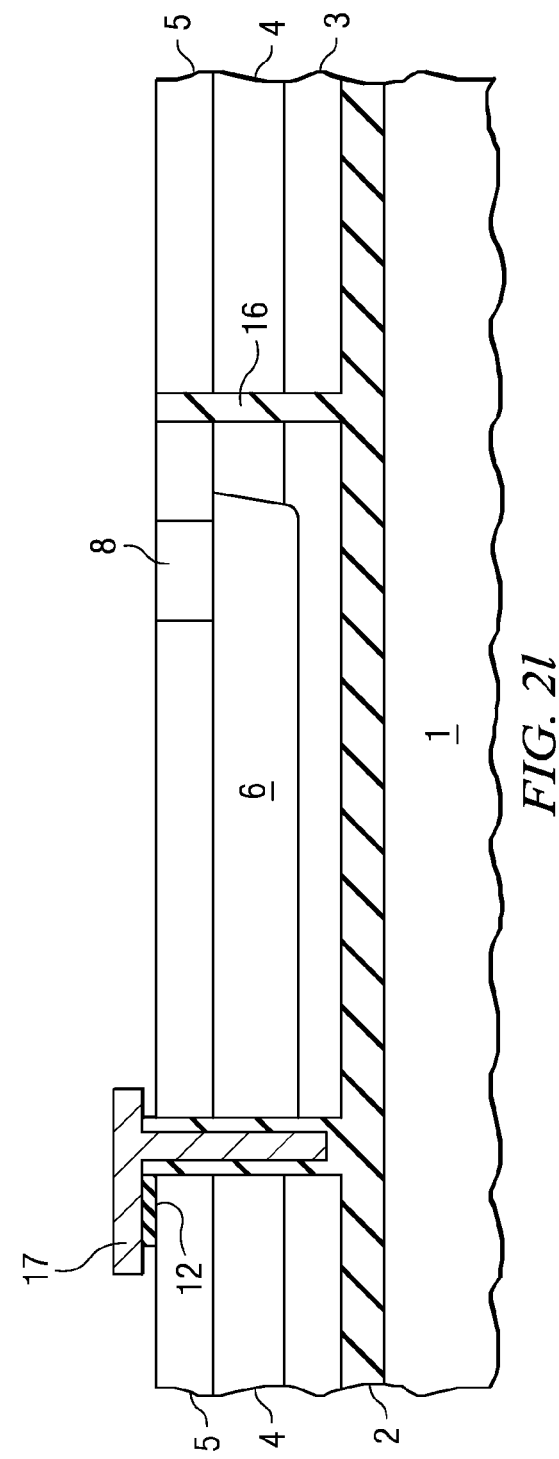
Figure 2M:
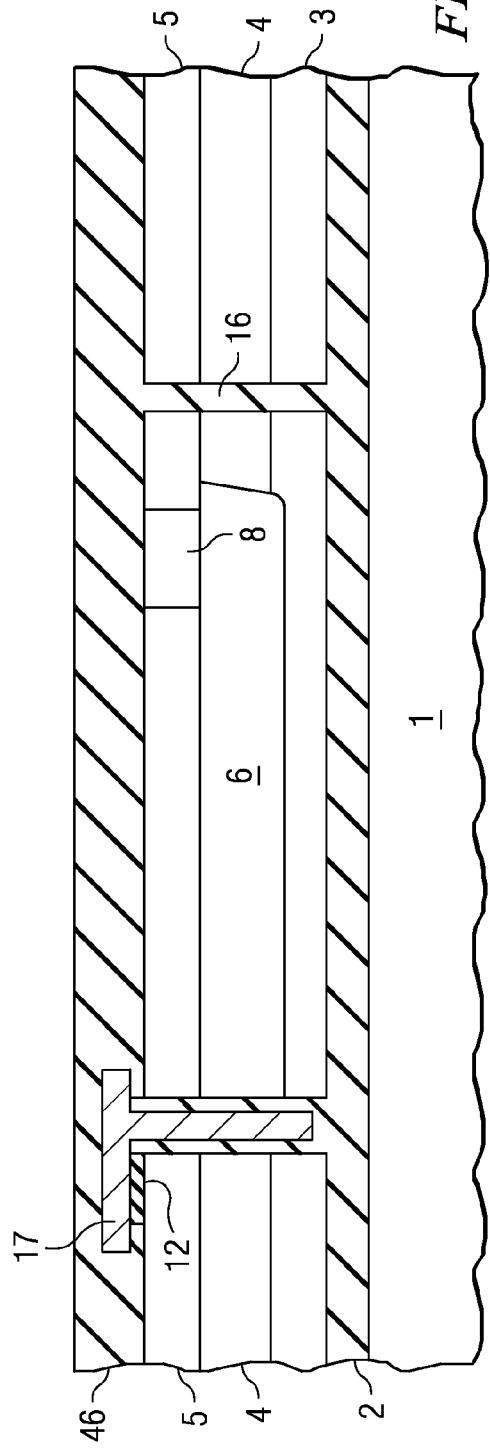
Figure 2N:
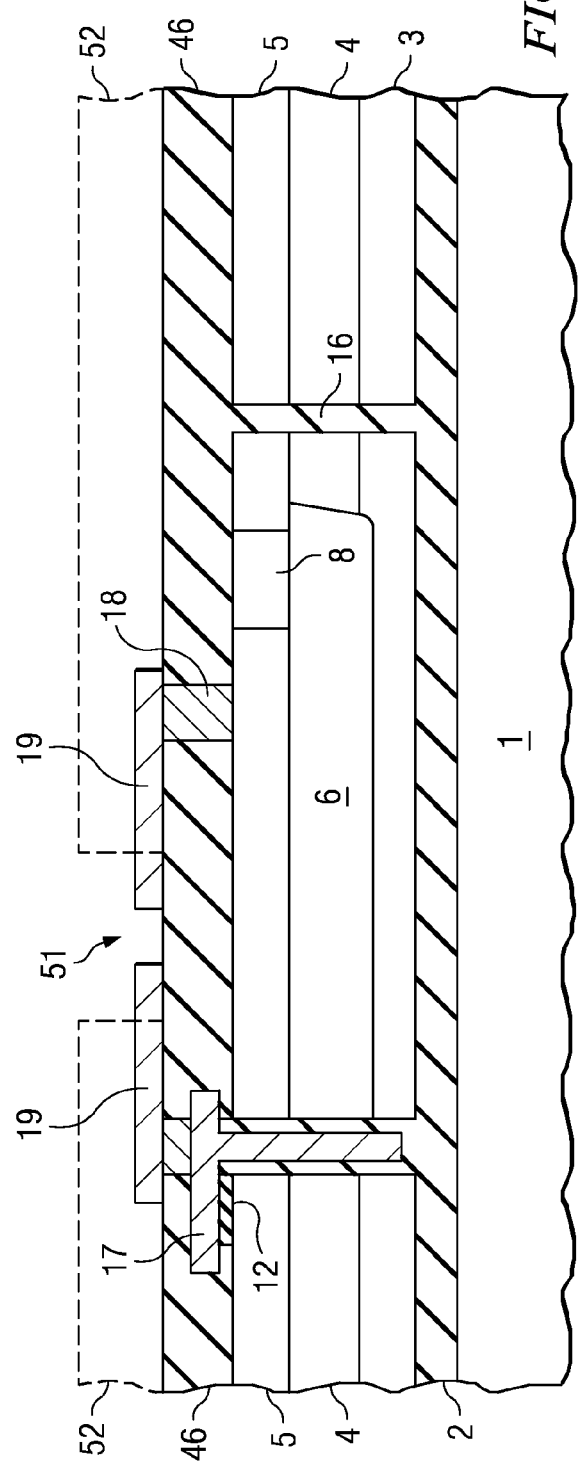

As illustrated in FIGS. 2l and 2m, the etch stop liner 12 is etched and a third insulating layer 46 is deposited. The third insulating layer 46 is planarized, for example, using a chemical mechanical polishing process. The third insulating layer 46 is patterned and fourth insulating layers 18 deposited in the patterned third insulating layer 46 as illustrated in FIG. 2n. A cover layer 19 comprising, for example, polysilicon is deposited over the third insulating layer 46, and patterned. A photo resist layer 52 is deposited and patterned to open only the opening 51.

Figure 2O:
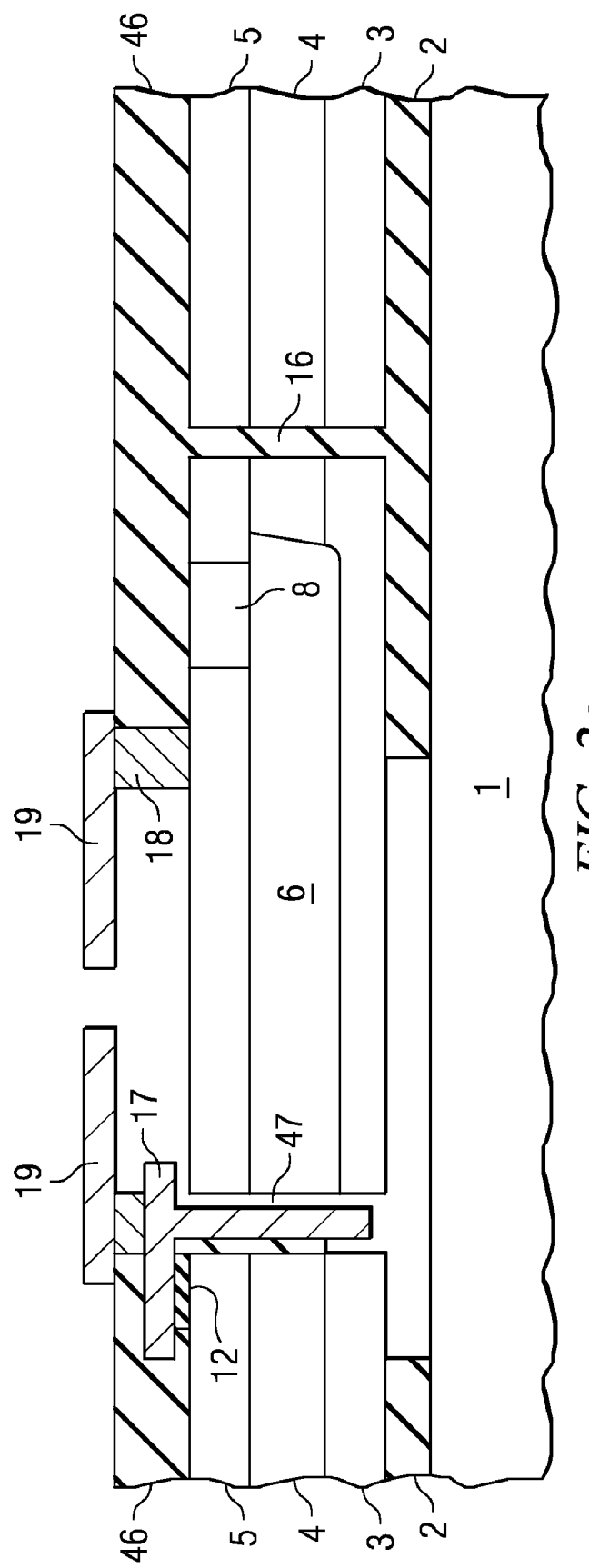

Referring to FIG. 2o, using the patterned cover layer 19 as a mask, the third insulating layer 46 is etched through the opening 51. The third insulating layer 46 is etched using a wet etch, which selectively etches the third insulating layer 46, the second insulating layer 16, and the underlying first insulating layer 2. The wet etch is typically timed to stop at the appropriate layer. In various embodiments, the wet etch comprises hydrofluoric acid. Examples include straight HF and buffered HF.

Figure 2P:
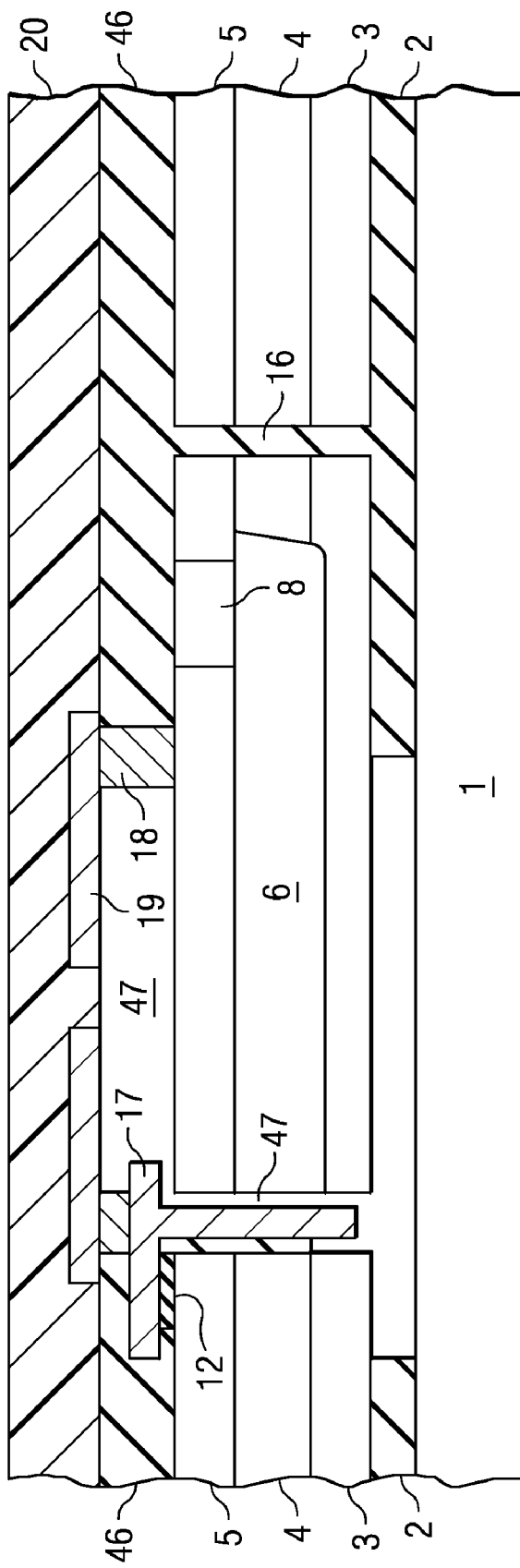

As illustrated in FIG. 2o, an air gap 47 is formed along the sidewalls of the first deep trench 31. The air gap 47 is encapsulated by depositing a fifth insulating layer 20 (FIG. 2p). The fifth insulating layer 20 is deposited using a chemical deposition process CVD process such as a low pressure process CVD, or other vapor deposition processes. The use of a low pressure process for the encapsulation helps to create the air gap 47 at a low pressure. In some embodiments, atmospheric pressure CVD may be used, which would correspondingly seal in gases at atmospheric pressure.

Figure 2Q:
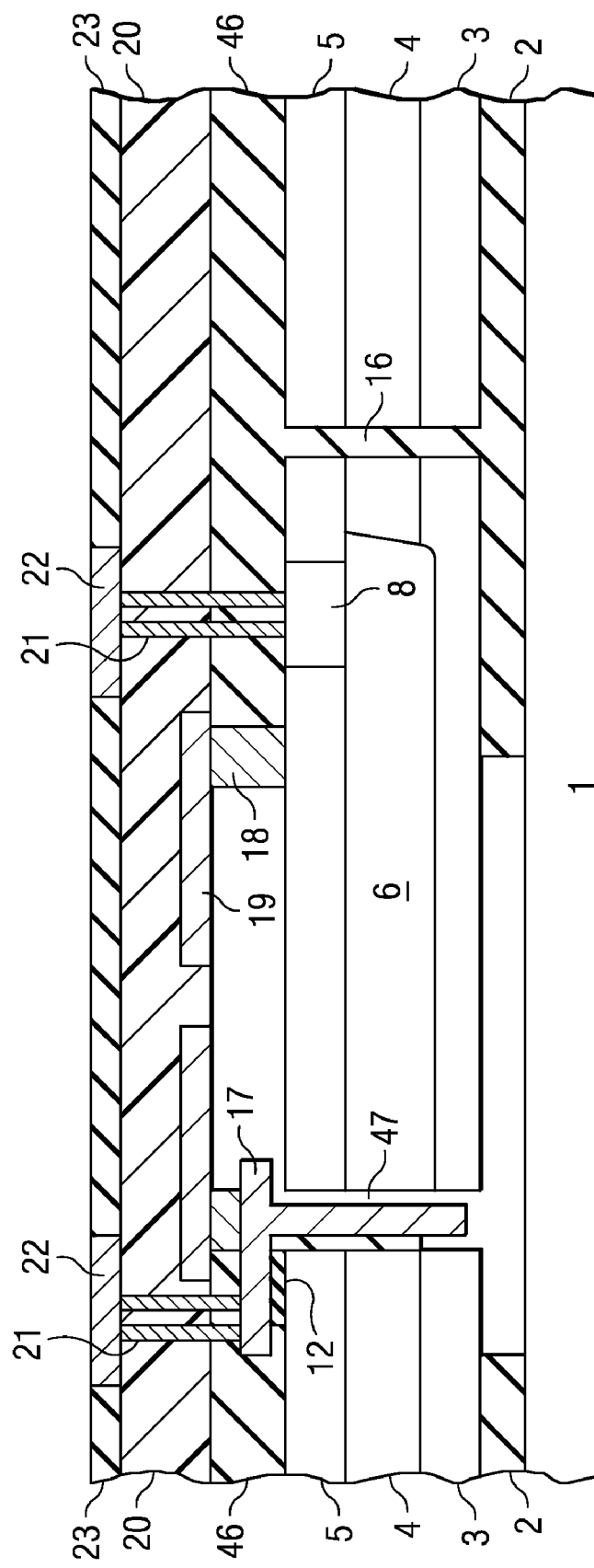

Referring next to FIG. 2q, the contacts 21 are formed through the fifth insulating layer 20 and the underlying third insulating layer 46 to contact the fourth doped layer 8 forming the resonator contact and the driver contact. A sixth insulating layer 23 is disposed over the fifth insulating layer 20, and comprises pads 22 for contacting.

Structural embodiments of the MEMS resonator device are described with respect to the cross-sectional views of FIGS. 4-8.

Figure 4:
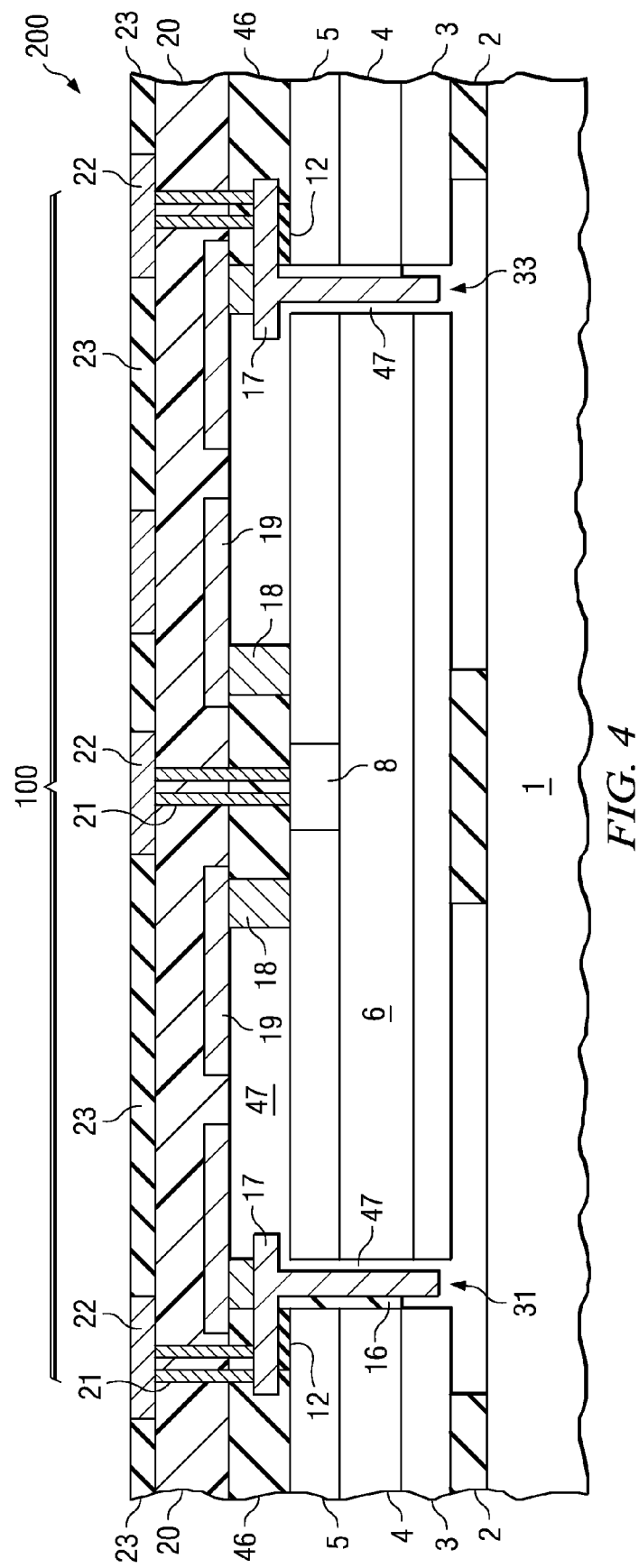
FIG. 4 illustrates a cross-sectional view of a MEMS device in accordance with an embodiment of the invention, wherein the MEMS device illustrates a structure with multiple driver electrodes.

Referring first to FIG. 4, the chip 200 comprises a MEMS resonator device 100, in accordance with an embodiment of the invention. Unlike the embodiment described in FIG. 1, the MEMS resonator device 100 illustrated in FIG. 4 comprises at least two deep trenches. The resonator electrode (second doped layer 6) is abutted between a first deep trench 31 and a third deep trench 33. The first deep trench 31 and the third deep trench 33 are filled forming two driver electrodes that may be biased simultaneously, for example, with a suitable phase difference.

Figure 5:
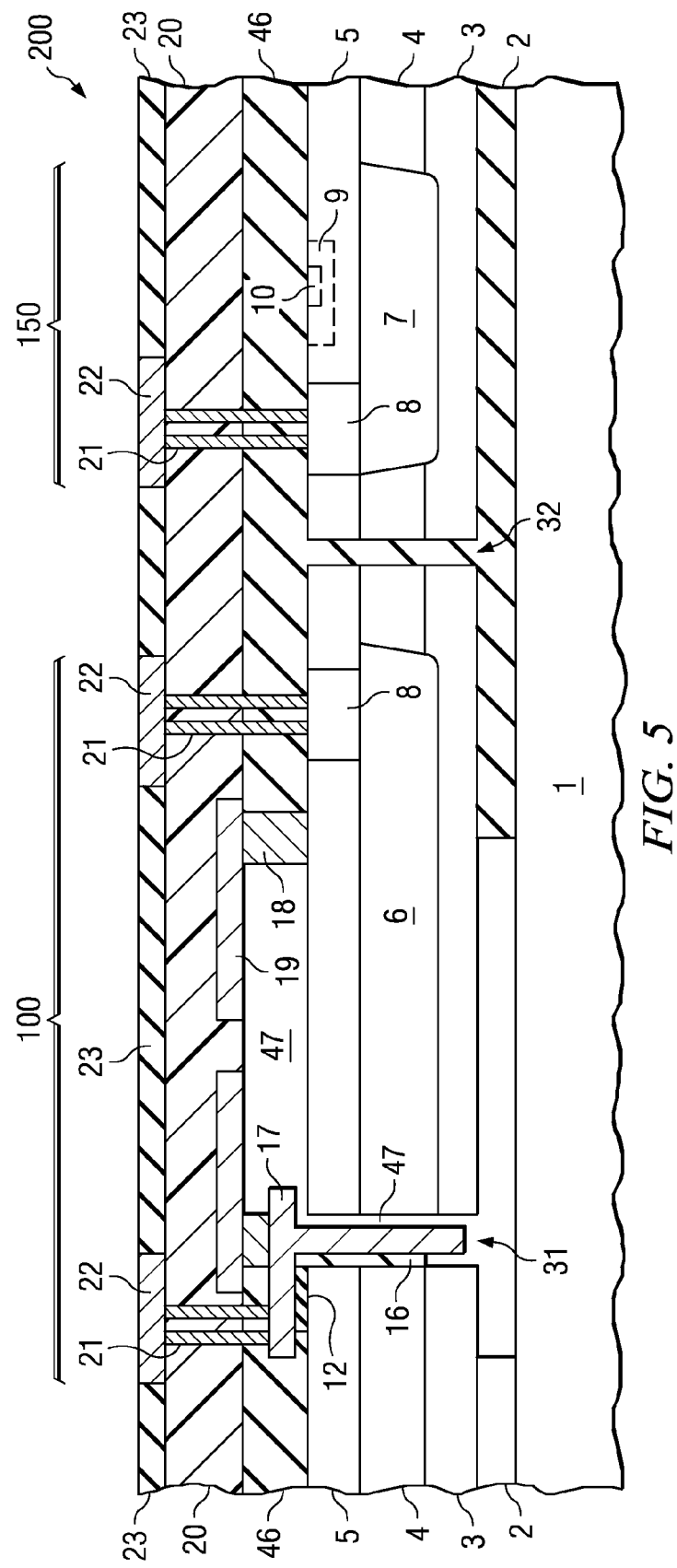
FIG. 5 illustrates a cross-sectional view of a semiconductor chip in accordance with an embodiment of the invention, wherein the semiconductor chip comprises a MEMS device and a bipolar device.

FIG. 5 illustrates an embodiment illustrating a single chip comprising bipolar transistors and MEMS devices. The bipolar transistors may be fabricated either adjacent to the MEMS devices or in different regions of the chip.

Referring to FIG. 5, the chip 200 comprises a MEMS resonator device 100 and a bipolar transistor 150 fabricated adjacent to each other. Further, as described with respect to FIGS. 2b and 2c, the bipolar transistors are fabricated along with the MEMS resonator device 100. Hence, the collector region 7 of the bipolar process and the resonator electrode (second doped layer 6) comprise similar doping and thicknesses (as they are formed from the same implant process as described in FIG. 2b). Similarly, a base region 9 comprising an opposite doping to the third doped layer 5 is disposed in the third doped layer 5. If the collector region 7 comprises an n-type doping, the base region comprises a p-type doping. An emitter region 10 of the bipolar transistor 150 is disposed above the collector region 7 and comprises a high doping of the same doping type as the collector region 7. In this example, the emitter region 10 comprises an n+ doping. As described with respect to FIG. 2c, the base region 9 and the emitter region 10 are formed along with the formation of the fourth doped layer 8.

Figure 6:
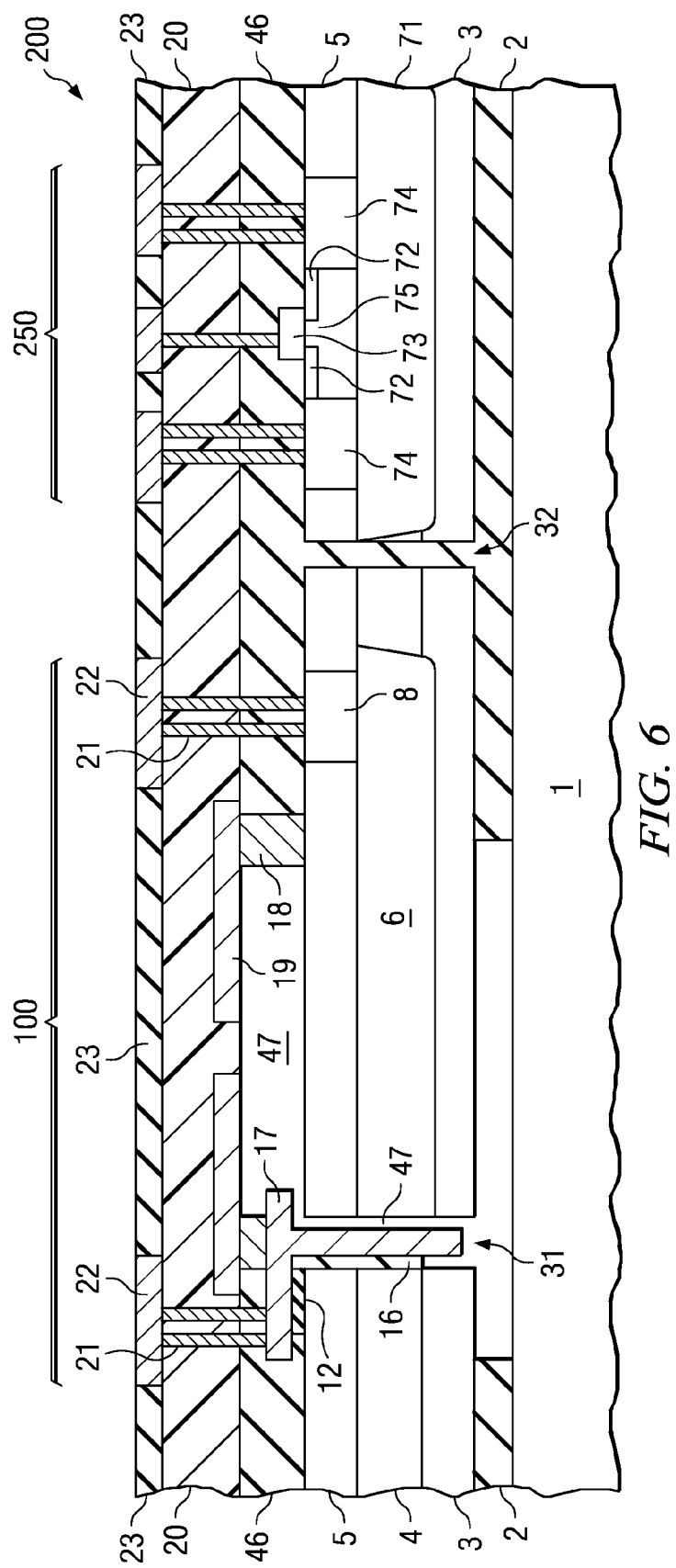
FIG. 6 illustrates a cross-sectional view of a semiconductor chip in accordance with an embodiment of the invention, wherein the semiconductor chip comprises a MEMS device and a CMOS device.

FIG. 6 illustrates an embodiment of a single chip comprising CMOS transistors and MEMS devices. The CMOS transistors may be fabricated either adjacent to the MEMS devices or in different regions of the chip.

Referring to FIG. 6, the chip 200 comprises a MEMS resonator device 100 and a CMOS transistor 250 fabricated adjacent to each other. Further, as described with respect to FIGS. 2b and 2c, the CMOS transistor 250 is fabricated along with the MEMS resonator device 100. Hence, the well 71 of the CMOS transistor and the resonator electrode (second doped layer 6) comprise similar doping and thicknesses (as they are formed from the same implant process as described in FIG. 2b). Similarly, source/drain regions 74 comprising an opposite doping to the third doped layer 5 is disposed in the third doped layer 5. If the third doped layer 5 comprises an n-type doping, the source/drain regions 74 comprise a p-type doping. The source/drain extensions 72 are also disposed in the third doped layer 5 and comprise similar doping to the source/drain regions 74. The channel region 75 of the CMOS transistor 250 is disposed in the third doped layer 5, and may comprise additional doping to minimize leakage currents between the source/drain extensions 72. As described with respect to FIG. 2c, the source/drain regions 74, the source/drain extensions 72, and channel region 75 are formed along with the formation of the fourth doped layer 8. A gate dielectric layer (not shown) is disposed above the channel region 75. The CMOS transistor 250 additionally comprises a gate region 73 disposed above gate dielectric layer and the channel region 75. In different embodiments, the gate region 73 may be formed along with the trench fill process as described in FIG. 2k.

Figure 7:
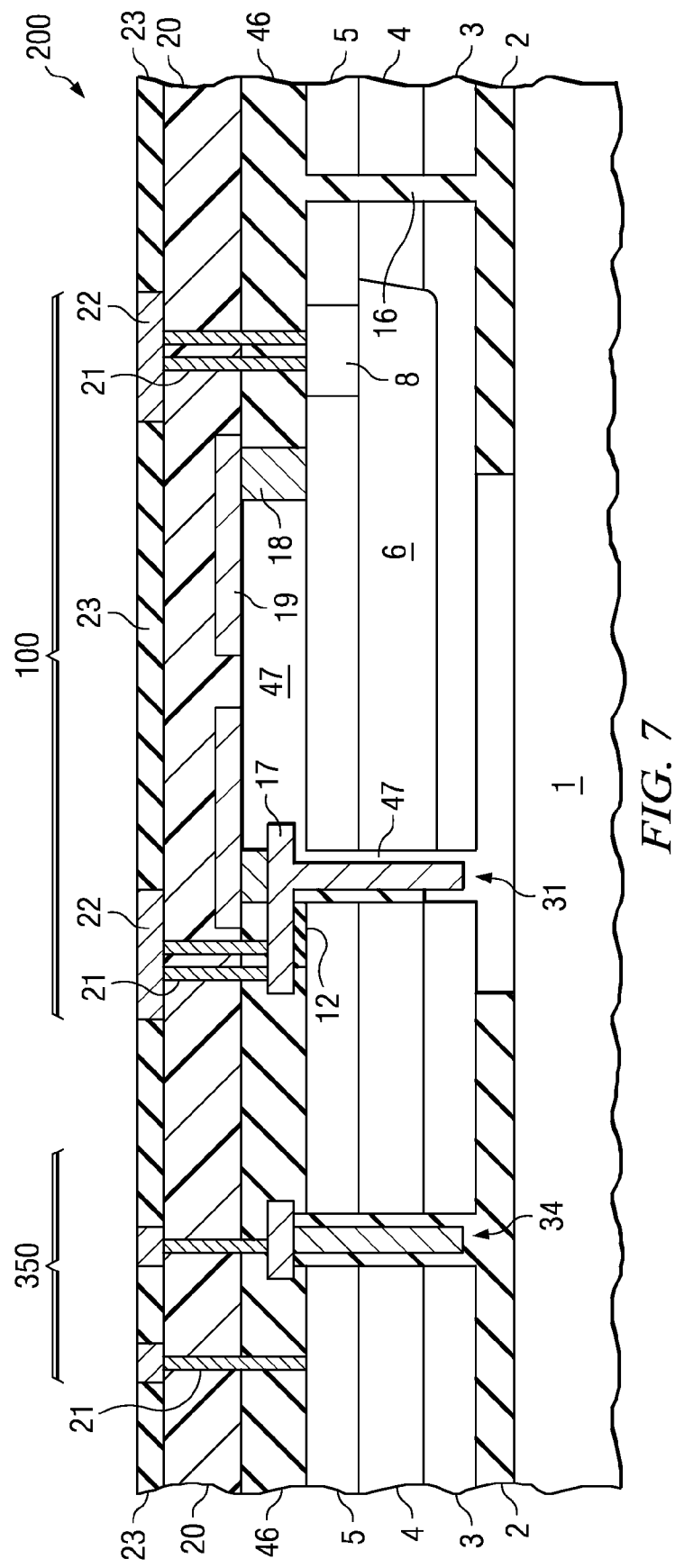
FIG. 7 illustrates a cross-sectional view of a semiconductor chip in accordance with an embodiment of the invention, wherein the semiconductor chip comprises a MEMS device and a trench capacitor.

FIG. 7 illustrates an embodiment of a single chip comprising trench capacitors and MEMS devices. The trench capacitors may be fabricated either adjacent to the MEMS devices or in different regions of the chip.

Referring to FIG. 7, the chip 200 comprises a MEMS resonator device 100 and a trench capacitor 350 fabricated adjacent to each other. The MEMS resonator device 100 comprises a structure similar to that described in FIG. 1. Hence, the chip comprises a first deep trench 31 forming the driving electrode of the MEMS resonator device 100, and an optional second deep trench 32 for isolation. As illustrated in FIG. 7, the trench capacitor 350 comprises a fourth deep trench 34. The trench fill 17 of the fourth deep 34 comprises a first electrode of the trench capacitor 350, and the first, second, third doped layers 3, 4, 5 comprise the second electrode of the trench capacitor 350, the second insulating layer 16 comprising the capacitive dielectric of the trench capacitor 350.

In various embodiments, the trench capacitor 350 is identical to the MEMS driver electrode except that the trench capacitor 350 does not comprise the air gap 47. The trench capacitor 350 may also comprise dimensions and layer thicknesses different from the driver electrode of the MEMS resonator device 100.

Figure 8:
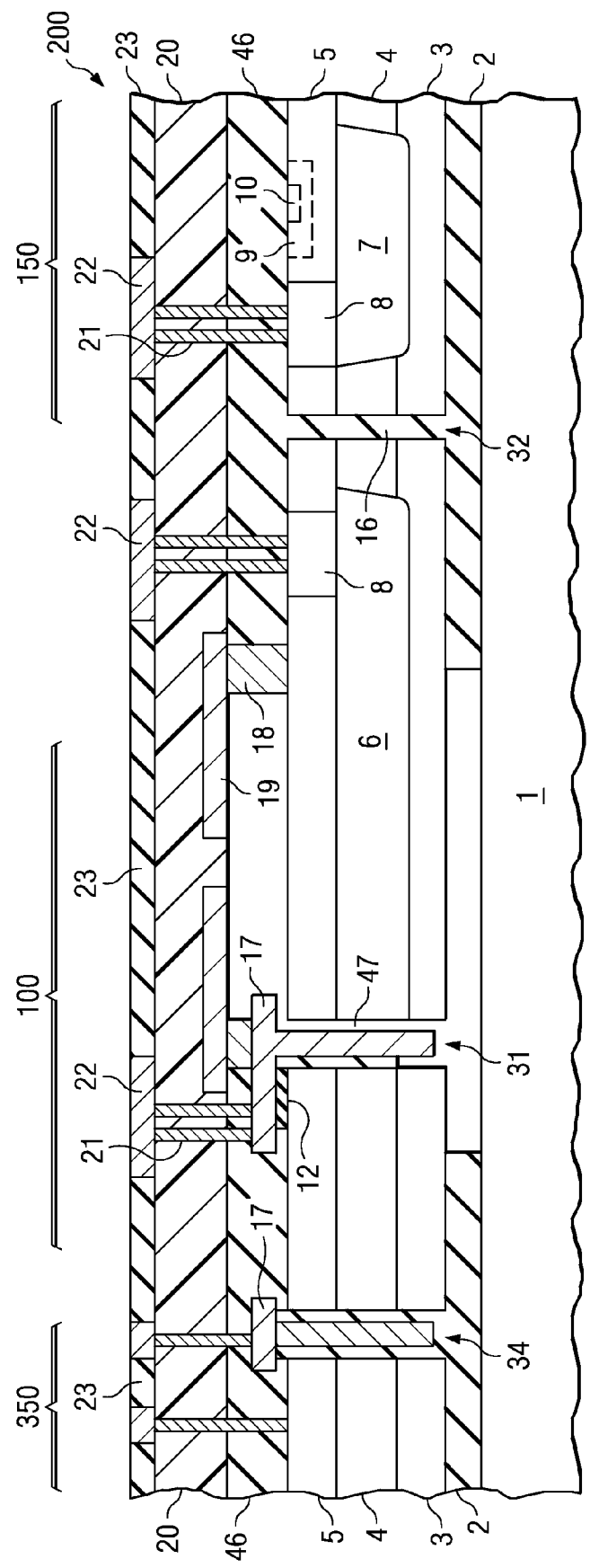
FIG. 8 illustrates a cross-sectional view of a semiconductor chip in accordance with an embodiment of the invention, wherein the semiconductor chip comprises a MEMS device, a bipolar device, and a trench capacitor.

FIG. 8 illustrates an embodiment of a single chip comprising bipolar transistors, MEMS devices and deep trench capacitors. The bipolar transistors and deep trenches may be fabricated either adjacent to the MEMS devices or in different regions of the chip.

The embodiment illustrated in FIG. 8 combines the embodiments of FIGS. 5 and 7. For example, the trench capacitor 350 is disposed on one side of the MEMS resonator device 100 and the bipolar transistor 150 is disposed on the other side of the MEMS resonator device 100. The MEMS resonator device 100, the bipolar transistor 150, and the trench capacitor 350 are fabricated in a common process flow as described in various embodiments. Advantageously combining common processes, manufacturing costs of the integrated chip can be significantly lowered.

Although embodiments of the present invention and their advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A micro-electromechanical system (MEMS) device, comprising:
    a semiconductive layer disposed over a substrate;
    a trench disposed in the semiconductive layer, the trench comprising a first sidewall and an opposite second sidewall;
    a first insulating material layer disposed over an upper portion of the first sidewall;
    a conductive material disposed within the trench;
    a first air gap disposed between the conductive material and the semiconductive layer; and
    a second air gap disposed over the substrate, the second air gap disposed between the substrate and a bottom surface of the semiconductive layer; and
    a second insulating layer disposed between the substrate and the bottom surface of the semiconductive layer.

2. The MEMS device of claim 1, wherein the semiconductive layer comprises a resonator layer, wherein the resonator layer comprises upper, middle and lower layers, the upper layer disposed on the middle layer, the middle layer disposed on the lower layer, wherein the upper and lower layers comprise a lower conductivity than the middle layer.

3. The MEMS device of claim 1, wherein the first air gap is disposed on the second sidewall and a lower portion of the first sidewall.

4. The MEMS device of claim 1, the first and second air gaps are connected.

5. The MEMS device of claim 4, wherein a third air gap extends over a top surface of the semiconductive layer, the top surface being opposite to the bottom surface, the third air gap being connected to the first air gap.

6. The MEMS device of claim 5, wherein the third air gap is encapsulated by a second insulating layer.

7. The MEMS device of claim 1, wherein the first air gap is further disposed between the conductive material and the substrate.

8. The MEMS device of claim 1, wherein the semiconductive layer comprises a first layer, the first layer being capacitively coupled to the conductive material through the first air gap.

9. The MEMS device of claim 8, wherein the semiconductive layer comprises second and third layers, the second layer disposed above the first layer and the third layer disposed below the first layer, the second and third layers comprising a higher resistance than the first layer.

10. The MEMS device of claim 1, wherein the semiconductive layer comprises an oscillating element, and wherein the oscillating element comprises a resonator, an actuator, a sensor, a switch, or an accelerometer.

11. The MEMS device of claim 1, wherein the first air gap comprises a thickness of about 500 nm or less to about 5 nm.

12. The MEMS device of claim 1, wherein the trench comprises a depth from about 500 nm to about 10000 nm, and wherein the trench comprises a ratio of depth to width that is less than about 10:1, and wherein the semiconductive layer comprises a thickness of about 250 nm to about 10000 nm.

13. The MEMS device of claim 1, further comprising:
an additional trench disposed in the semiconductive layer, the conductive material disposed within the additional trench, the additional trench comprising a third sidewall and an opposite fourth sidewall;
a fourth insulating material layer disposed over an upper portion of the third sidewall; and
a fifth air gap disposed between the fourth sidewall and the semiconductive layer.

14. The MEMS device of claim 1, wherein a first sidewall of the second air gap comprises the bottom surface of the semiconductive layer, a second sidewall of the second air gap comprises a sidewall of the second insulating layer, and a third sidewall of the second air gap comprises a surface of the substrate.

15. The MEMS device of claim 14, wherein the first sidewall is about orthogonal to the second sidewall.

16. A micro-electromechanical system (MEMS) device, comprising:
a semiconductive layer disposed over a substrate;
a first trench disposed in the semiconductive layer, the trench comprising a first sidewall and an opposite second sidewall;
a first insulating material layer disposed over an upper portion of the first sidewall of the semiconductive layer;
a conductive material disposed within the trench, the conductive material comprising a first sidewall and an opposite second sidewall; and
a first air gap within the trench, a first portion of the first air gap being disposed between the first sidewall of the conductive material and the first sidewall of the semiconductive layer, a second portion of the first air gap being disposed between the second sidewall of the conductive material and the second sidewall of the semiconductive layer.

17. The MEMS device of claim 16, wherein the first portion of the first air gap contacts the second sidewall and the second portion of the first air gap contacts a lower portion of the first sidewall.

18. The MEMS device of claim 16, wherein a length of the first portion of the first air gap along the trench is smaller than a length of the second portion of the first air gap along the trench.

19. The MEMS device of claim 16, further comprising a second air gap disposed over the substrate, the second air gap disposed between the substrate and a bottom surface of the semiconductive layer.

20. The MEMS device of claim 19, wherein the first and second air gaps are connected.

21. The MEMS device of claim 16, wherein the semiconductive layer comprises a resonator layer, wherein the resonator layer comprises upper, middle and lower layers, the upper layer disposed on the middle layer, the middle layer disposed on the lower layer, wherein the upper and lower layers comprise a lower conductivity than the middle layer.

22. The MEMS device of claim 16, wherein a third air gap extends over a top surface of the semiconductive layer, the third air gap being connected to the first air gap.

23. The MEMS device of claim 22, wherein the third air gap is encapsulated by a second insulating layer.

24. The MEMS device of claim 16, wherein the first air gap is further disposed between the conductive material and the substrate.

25. The MEMS device of claim 16, further comprising a second insulating layer disposed between the substrate and a bottom surface of the semiconductive layer.

26. The MEMS device of claim 16, wherein the semiconductive layer comprises a first layer, the first layer being capacitively coupled to the conductive material through the first air gap.

27. The MEMS device of claim 26, wherein the semiconductive layer comprises second and third layers, the second layer disposed above the first layer and the third layer disposed below the first layer, the second and third layers comprising a higher resistance than the first layer.

28. The MEMS device of claim 26, wherein the semiconductive layer comprises an oscillating element, and wherein the oscillating element comprises a resonator, an actuator, a sensor, a switch, or an accelerometer.

* * * * *